United States Patent [19]

Hartman et al.

[11] 4,156,247
[45] May 22, 1979

[54] TWO-PHASE CONTINUOUS POLY SILICON GATE CCD

[75] Inventors: John M. Hartman, Glendale; George S. Leach, Phoenix, both of Ariz.

[73] Assignee: Electron Memories & Magnetic Corporation

[21] Appl. No.: 750,774

[22] Filed: Dec. 15, 1976

[51] Int. Cl.² .................... H01L 29/78; H01L 29/04; G11C 19/28; B01J 17/00
[52] U.S. Cl. ........................................ 357/24; 357/59; 357/91; 307/221 D; 29/589
[58] Field of Search ............................. 357/24, 59, 91; 307/221 D

[56] References Cited

U.S. PATENT DOCUMENTS

| | | | |
|---|---|---|---|
| 3,728,590 | 4/1973 | Kim et al. | 357/24 |
| 3,836,409 | 9/1974 | Amelio et al. | 357/24 |
| 3,853,634 | 12/1974 | Amelio et al. | 357/24 |
| 3,863,065 | 1/1975 | Kosonocky et al. | 357/24 |
| 3,865,652 | 2/1975 | Agusta et al. | 357/24 |
| 3,967,365 | 7/1976 | Friedrich | 357/24 |
| 4,001,861 | 1/1977 | Carnes | 357/24 |

Primary Examiner—William D. Larkins
Assistant Examiner—Gene M. Munson

[57] ABSTRACT

This invention provides the structure for a two-phase charge coupled storage device. Alternate regions of thicker and thinner silicon dioxide are grown upon a silicon substrate. These silicon dioxide regions are covered with a layer of deposited, undoped polysilicon. A layer of silicon dioxide is grown over the polysilicon. Ion implantation is applied to cause isolated regions of conductivity in the polysilicon. Then contact windows are cut in the upper most layer of silicon dioxide exposing the polysilicon therethrough and a metal coating is deposited in the contact windows. Two-phase signals are applied to the resulting electrodes to advance charges at the surface of the silicon substrate.

6 Claims, 5 Drawing Figures

TWO-PHASE CONTINUOUS POLY SILICON GATE CCD

BACKGROUND OF THE INVENTION

This invention relates to charge coupled storage devices and more particularly to improvements therein.

The present preferred construction for a charged coupled storage device is one which has three or more clock phases for operating the device. The electrode structure of the three phase charge coupled device, or CCD, as it is more popularly known, has problems in that a gap is present between the metal electrode used for advancing charges down the CCD. The gap cannot be too wide, since if it is, one no longer has a homogenous flat surface potential underneath the CCD gates, which is necessary in order to enable the transfer of charge between the regions underneath the gates. The gap preferably should be on the order of one to two microns maximum. Thus far, the ability to etch geometrys that fine in production does not exist. In an attempt to overcome this, the industry uses overlapping gates in which the first and third gates are metal gates and the second gate is a poly silicon gate photolithic structure. This is a very complex structure. The overlapping gates, further more, give rise to objectionable interelectrode capacitance.

OBJECTS AND SUMMARY OF THE INVENTION

An object of this invention is the provision of a novel high density two-phase CCD.

Another object of this invention is the provision of a two-phase CCD that is simple to construct.

The foregoing and other objects of this invention may be achieved in an arrangement wherein on a silicon substrate, there is grown a layer of silicon dioxide (SiO$_2$) which has alternate thick and thin regions. A thin, high resistivity layer of undoped poly silicon is deposited over the entire silicon dioxide layer. A thin, uniform coating of silicon dioxide is then grown over the poly silicon layer.

The device is then subjected to ion-implantation in a manner so that ion-implantation exists substantially only at the peaks and in the troughs of the polysilicon which are formed on the surface as a result of the alternate thick and thin silicon dioxide lying underneath. The sloping sides joining the peaks and troughs are substantially not affected by the ion implantation.

So much of the top SiO$_2$ layer, as extends partially over each peak, then down to a trough and partially along the trough, is next removed to form a window for contacting the polysilicon layer and in its place a conductive metal is deposited to form electrodes. The conductive metal is deposited over the windows exposing the polysilicon layer. Each CCD electrode consists of the conductive polysilicon on the peak which becomes the transfer electrode, and the conductive poly silicon in the trough which becomes the storage electrode. The metal interconnects the two electrodes for each phase. Note that between phases the metal does not interconnect resulting in isolated electrodes.

The novel features of the invention are set forth with particularity in the appended claims. The invention will best be understood from the following description when read in conjunction with the accompanying drawings.

DESCRIPTION OF THE PREFERRED EMBODIMENTS

Figure 1:
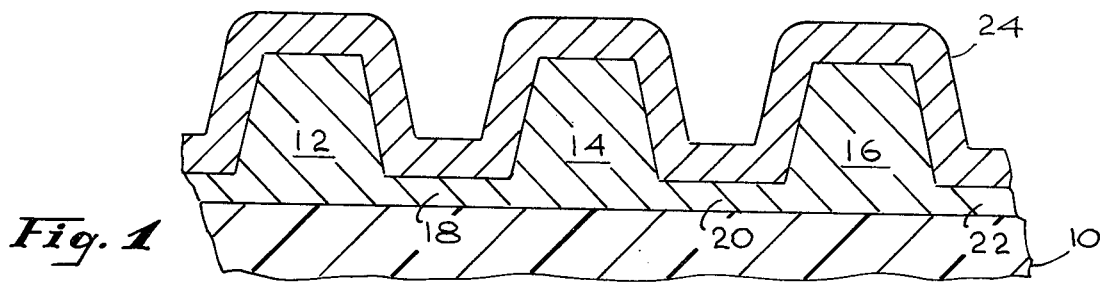
FIG. 1 is a view in section of a first step in the construction of an embodiment of this invention.

Referring now to FIG. 1, there is illustrated in cross section a first step in constructing an embodiment of this invention. On a silicon substrate 10, which may be on the order of 10 mils thick, there is grown silicon dioxide, which has alternate thick regions 12, 14, 16, and alternate thin regions 18, 20, 22. The thick regions 12, 14, 16, may be on the order of 6000 angstroms thick, and the thin regions may be on the order of 660 angstroms thick.

There is deposited over both thick and thin regions, a polysilicon layer 24, which has a very high resistivity, and is undoped, and may be on the order of 1500 angstroms thick. It will be noted, that the thick regions of the silicon dioxide form peaks and the thin regions form troughs. The troughs are on the order of 0.2 mils wide and the peaks are on the order of 0.3 mils wide.

It should be appreciated that the foregoing dimensions are illustrative and should not be considered as restrictive or as limitations upon this invention.

Figure 2:
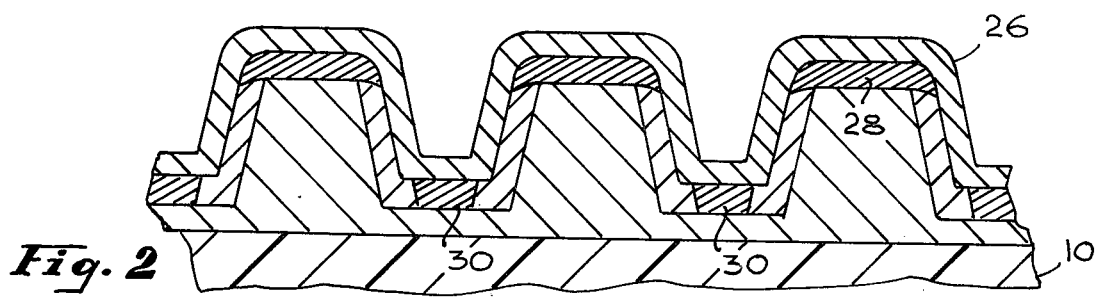
FIG. 2 is a view in section of the next step in the construction of the embodiment of the invention.

FIG. 2 illustrates in cross section, the next step in the construction of a two-phase CCD, in accordance with this invention. There is grown over the polysilicon layer, another silicon dioxide layer 26, which may be on the order of 1000 angstroms thick. Thereafter, the silicon dioxide surface is subjected to ion-implantation in order to obtain conductive regions. The implantation is perpendicular to the surface so that the ion-implantation substantially occurs in polysilicon regions at the peak and troughs respectively 28, 30, of the device, as represented by the shaded areas. In short, in view of the steep side slopes, between peaks and troughs, the ion-implantation regions are not continuous.

Figure 3:
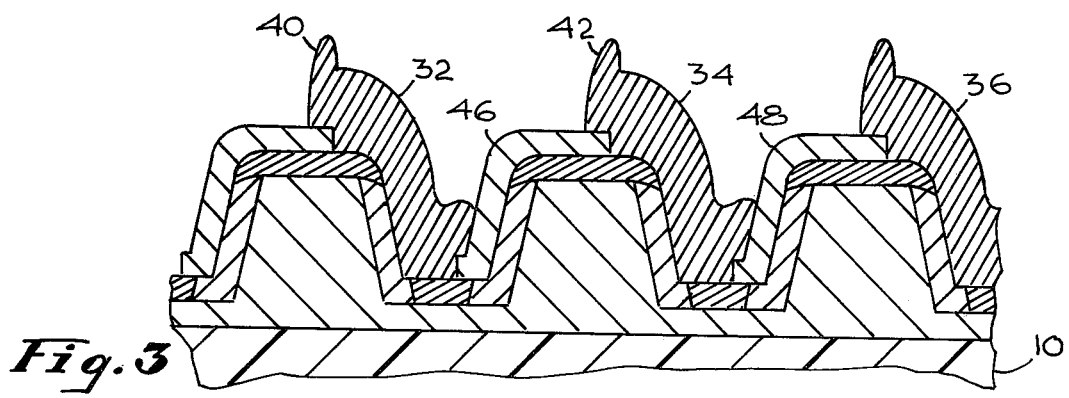
FIG. 3 is a view in section showing the finished appearance of the embodiment of the invention.
Figure 4:
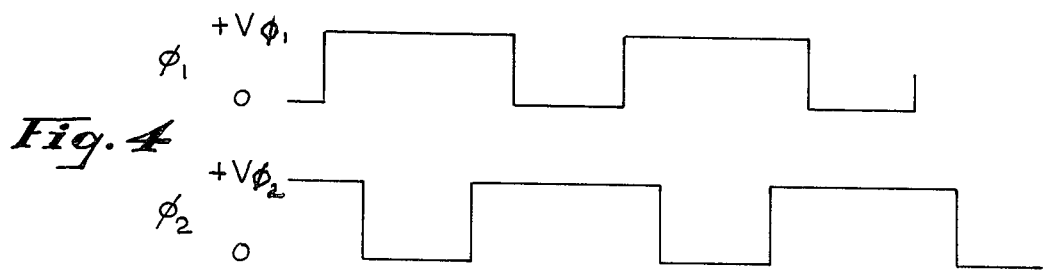
FIG. 4 illustrates waveforms used to drive the two-phase CCD of this invention.

Referring now to FIG. 3, the final step in the construction of the embodiment of the invention is shown in cross section. Contact windows are cut in the silicon dioxide over the polysilicon, as by chemical etching, so that effectively the underlying polysilicon surface extending from a peak down to a trough is exposed. The exposed polysilicon as well as a portion of the silicon dioxide adjacent thereto then has a conductive metal coating, respectively 32, 34, 36 and is applied thereto to form the electrodes. This metal may be aluminum. For the purposes of applying operating signals interconnecting conductors not shown connect the electrodes respectively 32, 34, 36 to the peripheral driving circuitry from which the waveforms shown in FIG. 4 are developed. Each metal electrode connects the ion implant region at a peak with the ion implant region in a succeeding trough whereby the transfer and storage regions of a two-phase CCD structure is made possible.

FIG. 4 shows waveforms illustrating the two-phase driving waveforms used for advancing charge patterns along the CCD. The θ1 and θ2 waveforms illustrate pulse trains in which a θ2 pulse rises to its maximum before a θ1 pulse falls to its minimum and a θ2 pulse terminates just after a θ2 pulse starts to rise.

Figure 5:
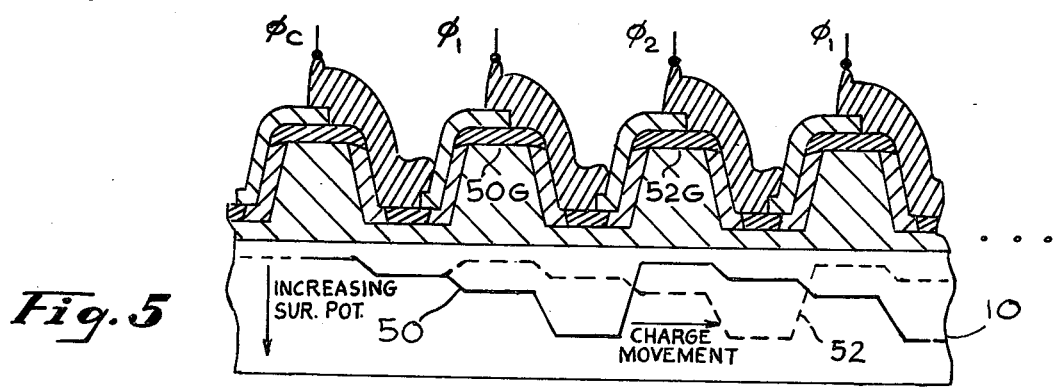
FIG. 5 is a cross sectional view of an embodiment of this invention together with a surface potential waveform, shown to provide a better understanding of the operation of this invention.

FIG. 5 is a cross sectional view of an embodiment of the invention and adjacent thereto waveforms illustrating movement of a charge pattern and surface potential waveform during a typical cycle.

Charges are clocked into the two-phase CCD device at the input terminal θC by applying a potential thereto. Thereafter by applying a θ1 pulse to the first terminal marked θ1, a surface potential 50 is established under the polysilicon gate 50G. The movement of the charges is determined by the surface potential; the charges seek highest surface potential which represents the lowest energy state and so they migrate under the thinner silicon dioxide region.

The θ2 waveform turns on before the θ1 waveform collapses. As θ1 collapses the surface potential underneath the θ1 polysilicon gate 50G collapses. There is nowhere for the charges to go but to the right under the θ2 electrode 52G which is high, with the resulting surface potential represented by the dotted line 52. Thus, a charge pattern can be transferred down the CCD device. Charge input and charge readout from the device is done in a manner well known to those skilled in the CCD art.

There has accordingly been described and shown a novel and useful construction for a two-phase charge coupled storage device.

We claim:

1. A two-phase charge coupled storage device shift register for shifting stored substrate charge comprising:
a silicon substrate,
a first layer of silicon dioxide over a surface of said silicon substrate, said first layer having alternate thicker and thinner regions and steeply inclined regions joining the thicker and thinner regions,
a substantially uniform layer of polysilicon over the exposed surface of said first silicon dioxide layer to define a peak over each said thicker silicon dioxide region and a trough over each said thinner region of silicon dioxide and steeply inclined portions of said polysilicon layer over said steeply inclined regions and joining said peak and trough portions of said polysilicon layer, said polysilicon of said peak and trough regions being conductive and being substantially non-conductive therebetween in said steeply inclined portions thereof, each first peak region being succeeded by a first trough region and next by succeeding second peak and trough regions,
a second substantially uniform layer of silicon dioxide overlying said polysilicon layer and having a plurality of first and second apertures therethrough each extending from a peak region to a following trough region to expose corresponding first and second portions of the underlying polysilicon layer, each of said first and second exposed portions of the polysilicon layer comprising an end portion of a conductive polysilicon region at a corresponding first and second peak region and the substantially non-conductive steeply inclined portion of said polysilicon layer following adjacent thereto and an end portion of the succeeding conductive polysilicon region in the succeeding trough region, and
a first conductive metal layer deposited through each second aperture of said second silicon dioxide layer and overlying and making contact with the corresponding second exposed portion of said polysilicon layer and lapping over the edges of said aperture at the peak and trough regions to overlie portions of said second silicon dioxide layer at the peak and trough regions.

2. A two-phase charge coupled storage device as recited in claim 1 wherein said polysilicon at the regions of said peaks and said troughs are ion implanted regions to enhance their conductivity.

3. A two-phase charge coupled storage device as recited in claim 1 further including a second conductive metal layer connecting each first conductive polysilicon region on the peaks with the succeeding conductive region of polysilicon on the next succeeding trough, and means for applying first and second phase pulse wave trains respectively to said second and first conductive metal layers.

4. A two-phase CCD as recited in claim 1 wherein the thicker region of said first silicon dioxide layer is approximately 6000 angstroms thick and the thinner region is approximately 600 angstroms thick,
wherein said polysilicon layer is approximately 1500 angstroms thick, and
said second silicon dioxide layer is approximately 1000 angstroms thick.

5. The charge coupled storage device shift register of claim 1 wherein the peak portions of the polysilicon layer each have an outer perimeter and the conductive portions of each peak portion of the polysilicon layer extend to its outer perimeter and overly and cap the steeply inclined substantially non-conductive portions of the polysilicon layer.

6. The charge coupled storage device shift register of claim 1 wherein the first conductive metal layer also extends over a lower end portion of the silicon dioxide overlying the next succeeding steeply inclined portion of said polysilicon layer, the metal layer being spaced above and insulated from the corresponding steeply inclined portion of the polysilicon layer by the intervening layer of silicon dioxide.

* * * * *

UNITED STATES PATENT OFFICE
CERTIFICATE OF CORRECTION

Patent No. 4,156,247           Dated May 22, 1979

Inventor(s) JOHN M. HARTMAN, ET AL.

It is certified that error appears in the above-identified patent and that said Letters Patent are hereby corrected as shown below:

Title page, Column 1, line 7, after "[73] Assignee:" delete "Electron" and insert therein --Electronic--.

Signed and Sealed this

First Day of January 1980

[SEAL]

Attest:

SIDNEY A. DIAMOND

Attesting Officer

Commissioner of Patents and Trademarks